United States Patent [19]

Nonaka

[11] Patent Number: 4,949,275
[45] Date of Patent: Aug. 14, 1990

[54] SEMICONDUCTOR INTEGRATED CIRCUIT DEVICE MADE BY A STANDARD-CELL SYSTEM AND METHOD FOR MANUFACTURE OF SAME

[75] Inventor: Terumoto Nonaka, Hamamatsu, Japan

[73] Assignee: Yamaha Corporation, Hamamatsu, Japan

[21] Appl. No.: 752,934

[22] Filed: Jul. 8, 1985

[30] Foreign Application Priority Data

Jul. 13, 1984 [JP] Japan .............................. 59-145537

[51] Int. Cl.$^5$ .......................................... G06F 15/60
[52] U.S. Cl. .................... 364/490; 364/489; 364/488
[58] Field of Search ............... 364/489, 490, 491, 200, 364/900, 525, 488; 307/453, 219, 465, 441, 442; 357/51, 68

[56] References Cited

U.S. PATENT DOCUMENTS

| H512 | 8/1988 | Borgini et al. | 357/42 |
|---|---|---|---|
| 3,943,551 | 3/1976 | Skorup | 357/51 |
| 4,228,528 | 10/1980 | Cenker et al. | 307/441 |
| 4,240,094 | 12/1980 | Mader | 307/465 |
| 4,371,795 | 2/1983 | Mulder et al. | 307/453 |
| 4,467,438 | 8/1984 | Zerlaut et al. | 364/525 |
| 4,484,292 | 11/1984 | Hong et al. | 364/491 |
| 4,551,815 | 11/1985 | Moore et al. | 307/441 |
| 4,568,961 | 2/1986 | Noto | 357/68 |
| 4,577,276 | 3/1986 | Dunlop et al. | 364/491 |
| 4,584,653 | 4/1986 | Chih et al. | 364/491 |
| 4,593,351 | 6/1986 | Hong et al. | 364/200 |
| 4,613,940 | 9/1986 | Shenton et al. | 364/491 |

OTHER PUBLICATIONS

"Introduction to MOS LSI Design" by Mavor, Addison-Wesley Publishers Limited, 1983, pp. 6, 142-143, 146 and 169.

Kessler et al., "Standard Cell VLSI Design: A Tutorial", IEEE Circuits and Devices Magazine, Jan. 1985, pp. 17-34.

Tokuda et al., "A Hierarchial Standard Cell Approach for Custom VLSI Design", IEEE Transactions on Computer-Aided Design, vol. CAD-3, No. 3, Jul. 1984, pp. 172-177.

*Primary Examiner*—Parshotam S. Lall
*Assistant Examiner*—V. N. Trans
*Attorney, Agent, or Firm*—Spensley, Horn, Jubas & Lubitz

[57] ABSTRACT

A semiconductor integrated circuit device comprises a semiconductor chip with a plurality of standard cells formed thereon. Each of said standard cells consists of at least one type of standard cell which is selected from among a plural types of standard cells which are preregistered in a standard cell library retained by a computer. The placement and routing pattern of said standard cells on said semiconductor chip are designed automatically by a computer system. In relation to at least one of said standard cells, at least one basic cell for general-purpose logical gate is formed on said semiconductor chip to deal with design modification of the device.

20 Claims, 5 Drawing Sheets

SEMICONDUCTOR INTEGRATED CIRCUIT DEVICE MADE BY A STANDARD-CELL SYSTEM AND METHOD FOR MANUFACTURE OF SAME

BACKGROUND OF THE INVENTION (a) Field of the invention:

The present invention relates to a large-scale semiconductor integrated circuit device (called LSI hereinafter) and more particularly to an LSI made by a standard-cell system.

(b) Description of the prior art:

In order to construct various hardware systems, there have been already used LSI's of various types shown in FIG. 1, that is, standard logics such as TTL, microprocessor, semi-custom LSI and full-custom LSI. Among them, the types which can realize logic designs as desired are a semi-custom LSI including ROM, PLA (Programmable Logic Array), gate array and standard-cell LSI, and a full-custom LSI of manual design. The gate array LSI is manufactured to change only the final metallization steps of the manufacturing process using a master slice, thereby realizing the desired logic; and the full-custom LSI is manufactured in accordance with any desired specification from the first step of the manufacturing process.

Of the semi-custom LSI, the standard-cell LSI is designed by selecting proper standard cells from a standard cell library which is stored in a computer and in which are registered in advance such various standard cells having any desired logical functions as counter, buffer, etc. comprising plural circuit elements such as transistor, resistor, etc. An example of the standard cell library is shown in Table 1. The layout on a semiconductor chip is conducted, by means of a CAD/CAE (Computer Aided Design/ Computer Aided Engineering) system, so that the standard cells are automatically placed at proper positions on the semiconductor chip and the routing between the respective standard cells is also automatically carried out. Therefore, the standard-cell LSI is a semi-custom LSI standardized in its constituent elements but is manufactured according to any desired specification from the first step of the manufacturing process as in the full-custom LSI in the manufacture.

TABLE 1

| GROUP | FUNCTION | NAME |
|---|---|---|
| GATE | INVERTER, NAND 1 OUTPUT | NOT1 |
| | INVERTER, NAND 2 OUTPUT | NOT2 |
| | INVERTER, NAND 3 OUTPUT | NOT3 |
| | INVERTER, NAND 4 OUTPUT | NOT4 |
| | 2 INPUT OR | OR2 |
| | 3 INPUT OR | OR3 |
| | 4 INPUT OR | OR4 |
| | 2 INPUT NOR | NOR2 |
| | 3 INPUT NOR | NOR3 |
| | 4 INPUT NOR | NOR4 |
| | EXCLUSIVE OR | EOR |
| | EXCLUSIVE NOR | EORN |
| BUFFER (POWER GATE) | POWER INVERTER | NOTP |
| | NON INVERTING BUFFER 1 OUTPUT | BUF1 |
| | NON INVERTING BUFFER 2 OUTPUT | BUF2 |
| MULTIPLEXER | 8 TO 1 MULTIPLEXER | MPX1 |
| | 4 TO 1 MULTIPLEXER | MPX2 |
| | DUAL 4 TO 1 MULTIPLEXER | MPX3 |
| | 2 TO 1 MULTIPLEXER | MPX4 |
| | QUAD 2 TO 1 MULTIPLEXER | MPX5 |
| FLIP-FLOP | D FLIP-FLOP | DF1 |
| | D FLIP-FLOP WITH OE | DF1E |
| | D FLIP-FLOP WITH RESET | DFR |
| | D FLIP-FLOP WITH RESET & OE | DFRE |
| | D FLIP-FLOP WITH SET & RESET | DFQ |
| | D FLIP-FLOP WITH SET, RESET & OE | DFQE |
| | JK FLIP-FLOP | JK |
| | JK FLIP-FLOP WITH OE | JKE |
| SHIFT-REGISTER | 1 BIT SYNC LOAD SR | SPL |
| | 1 BIT ASYNC LOAD SR | SP |
| LATCH | TRANSPARENT LATCH | LC |
| | TRANSPARENT LATCH WITH OE | LCE |
| | TRANSPARENT LATCH WITH RESET | LCR |
| | TRANSPARENT LATCH WITH RESET & OE | LCRE |
| COUNTER | 4 BIT SYNC UP COUNTER | CTUL |
| | 4 BIT SYNC UP COUNTER WITH DIRECT CLEAR | CTU |
| | 4 BIT SYNC UP/DOWN COUNTER | CTUD |
| | 4 BIT SYNC UP COUNTER WITHOUT PRESET | CTR |
| | 1 BIT RIPPLE COUNTER | TFQ |
| ADDER | 1 BIT FULL ADDER | FA |
| | 4 BIT FULL ADDER WITH FAST CARRY | FA4 |
| | 1 BIT HALF ADDER | HA |
| COMPARATOR | 4 BIT MAGNITUDE COMPARATOR | CMP |
| DECODER | 3 TO 8 DECODER | DEC1 |
| DECODER | 2 TO 4 DECODER | DEC2 |
| DELAY ELEMENT | 8 GATES DELAY | DLY8 |

(STANDRAD CELL LIBRARY OF SITL LSI)

TABLE 1-continued

| (STANDRAD CELL LIBRARY OF SITL LSI) | | |
|---|---|---|
| GROUP | FUNCTION | NAME |
| I/O BUFFER | LS INPUT BUFFER | IBLS |
| | S INPUT BUFFER | IBS |
| | LS OUTPUT BUFFER | OBLS |
| | S OUTPUT BUFFER | OBS |
| | LS I/O BUFFER | IOBLS |
| | LS TRI-STATE OUTPUT BUFFER | OBLST |
| | LS SCHMITT TRIGGER INPUT BUFFER | SIB |
| | LS LINE DRIVER | OBLSL |
| | LS OPEN DRAIN OUTPUT BUFFER | OBLSO |
| | TRI-STATE CONTROL BUFFER | BUFTC |
| SPECIAL CELL | CRYSTAL OSCILLATOR | XOS |
| ROM | 32 WORD × 8 Bit (256 Bit) | ROM0 |
| | 128 WORD × 8 Bit (1 kBit) | ROM1 |
| | 512 WORD × 8 Bit (4 kBit) | ROM4 |
| RAM | 32 WORD × 8 Bit (256 Bit) | RAM1 |

Here, the manual design full-custom LSI, standard-cell LSI and gate array are compared in respect of a plurality of items in Table 2.

TABLE 2

| | FULL-CUSTOM | | SEMI-CUSTOM |
|---|---|---|---|
| ITEM | MANUAL | STANDARD-CELL | GATE-ARRAY |
| LSI DESIGN BY USERS | x | ○ | ○ |
| UNNECESSITY OF KNOWLEDGE OF PROCESS AND DEVICE | x | ○ | ○ |
| FREEDOM OF FUNCTION (MEMORY, etc.) | ◉ | ○ | x |
| LAYOUT ERROR | x | ○ | ○ |
| LAYOUT COST | x | ○ | ○ |
| LAYOUT PERIOD | x | ○ | ○ |
| FREEDOM OF GATE NUMBER | ○ | ○ | x |
| OPTIMIZATION OF I/O BUFFER (SPEEED, DRIVING POWER) | ○ | ○ | x |
| FREEDOM OF CHARACTERISTICS (SCHMITT TRIGGER, etc. | ○ | ○ | x |
| DEVELOPMENT COST | x | ○ | ○ |
| DEVELOPMENT TIME | x | ○ | ○ |
| INTEGRATION DEGREE (CHIP COST) | ◉ | ○ | x |
| SPEED CHARACTERISTIC | ◉ | ○ | x |
| KEEPING OF CONFIDENTIALITY | ○ | ◉ | ◉ |
| MULTI-FUNCTION | ○ | ○ | x | x - NOT GOOD,
○ - GOOD.
◉ - VERY GOOD

According to Table 2, the standard-cell LSI has following advantages over the gate array. The gate array is formed of a logical block called a macro cell which is constituted by a combination of general-purpose basic gates and which therefore contains gates which are eventually not used; on the other hand, the standard-cell LSI is formed of standard cells having respectively only specific functions, and has no gate which is not used, that is, no excess gate. Therefore, for example, in the case of constructing a same flip-flop, the standard cell LSI will have an occupied area smaller than that of the gate array. Also, it is possible to provide as standard cells CPU, RAM, ROM, PLA,. etc., resulting in large freedom of function. Further, in the standard-cell system, there is no restriction on number of gates and the chip can be comprised of properly requisite number of gates. Various speeds and current driving power characteristics are also possible and a buffer such as a Schmitt trigger can be available in the standard-cell system. By the way, the PLA is not shown in Table 2 but is greatly restricted in the integration degree and function, and is therefore found to be inadequate to be made large on the scale.

The standard-cell LSI has many advantages as described above but, at the same time, has a defect that the logic and timing of the first designed specification can not be easily changed. It is recently so increasingly required to develop devices within a short turn around time. To this end, it is required to be able to first develop an LSI with a provisional specification and to finally alter the specification such as logic, timing, etc. of the LSI. The conventional standard-cell LSI has not been able to satisfy such requirement. In the conventional standard-cell LSI, the LSI must be manufactured newly from the first step of the manufacturing process after altering the design. Thus, in the conventional standard-cell LSI, there has been a great problem that, in order to change the specification such as logic, timing, etc., the development time and cost will increase.

SUMMARY OF THE INVENTION

An object of the present invention is to provide a standard-cell large-scale semiconductor integrated circuit device wherein the specification such as logic, timing, etc. can be easily altered so that the development time and cost are not increased by the change of the specification.

According to the present invention, this object is attained by a semiconductor integrated circuit device comprising a semiconductor chip with a plurality of standard cells formed thereon, each of said standard cells consisting of at least one type of standard cell which is selected from among a plural types of standard cells which are pre-registered in a standard cell library retained by a computer, the placement and routing pattern of said standard cells on said semiconductor chip being designed automatically by a computer system, wherein, in relation to at least one of said standard cells, at least one basic cell for a general-purpose logical gate or gates is formed on said semiconductor chip.

Here, the "general-purpose logical gate" means a logical gate having general purposes and used as a basic gate in a conventional gate array. An example of such gate is a gate GT having one input and four outputs used as "4 NAND" as is shown in FIG. 2. If two "4 NAND" gates $GT_1$ and $GT_2$ of such construction are coupled as in FIG. 3, an R-S flip-flop shown in FIG. 4 is realized. The basic cell for general-purpose logical gate comprises a plurality of circuit elements such as transistors, diodes, resistors, etc., and is formed on a semiconductor chip so as to be able to be wired later to realize a required function. Thus, when the above mentioned basic cell is formed on the semiconductor chip and then the circuit elements within said basic cell are properly wired, a logical gate provided with and desired logic can be constructed.

According to this invention, in a standard-cell semiconductor integrated circuit device consisting of a plurality of standard cells, with respect to at least one standard cell, the basic cell for the general-purpose logical gate is formed on a semiconductor chip, and therefore said basic cell can be used instead of or in addition to any of the standard cells. That is, the wiring and routing of said basic cell can be carried out later and, therefore, by suitable designing the wiring and routing of the basic cell, the specification such as logic, timing, etc. of the semiconductor integrated circuit device of the standard-cell system can be easily altered. Thus, by first developing the semiconductor integrated circuit device with a provisional specification and then altering only the final wiring and routing step of the manufacturing process, a semiconductor integrated circuit device of any desired specification can be obtained. Particularly, in the case of a bipolar LSI or SIT (Static Induction Transistor) LSI, since its operating speed will depend predominantly on the delay by the elements themselves and will not depend so much on the length of the wiring, the operating speed will be little reduced by the change of the wiring. Therefore, the present invention is advantageously utilized in such LSI's. Further, as the semiconductor integrated circuit device according to the present invention is constructed by only adding the basic cells of general-purpose logical gates to a standard-cell semiconductor integrated circuit device, it can be simply manufactured by only slightly changing the manufacturing process and computer processing, and retains various advantages of the standard-cell semiconductor integrated circuit device.

DESCRIPTION OF THE PREFERRED EMBODIMENTS

Figure 1:
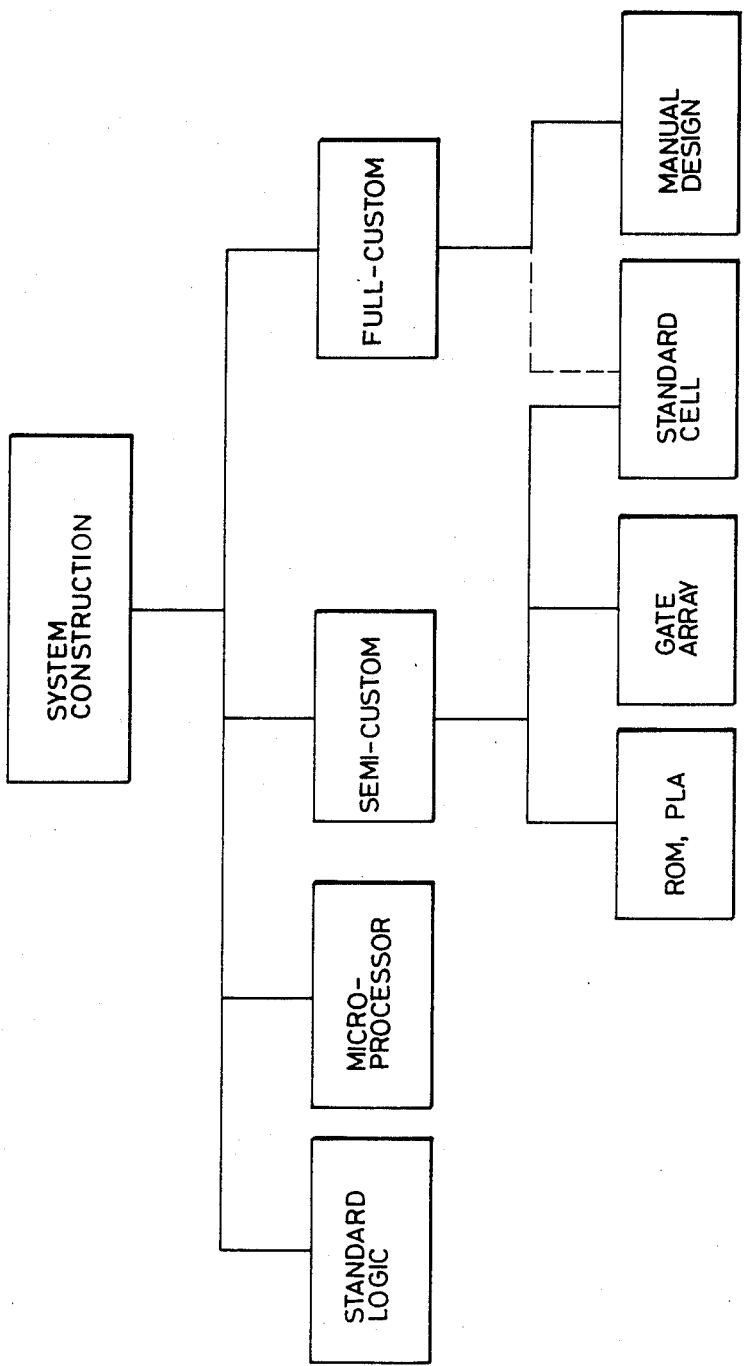
FIG. 1 is a view showing the classification of devices for constructing the system.
Figure 2:
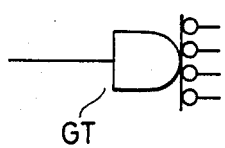
FIG. 2 is a view showing an example of the general-purpose logical gate.
Figure 3:
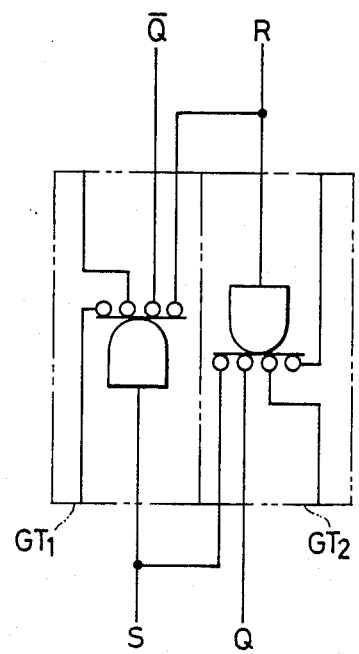
FIG. 3 is a circuit diagram of a flip-flop consisting of two gates shown in FIG. 2.
Figure 4:
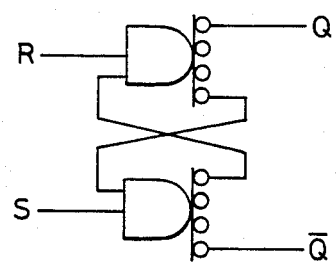
FIG. 4 is an equivalent circuit diagram of the flip-flop in FIG. 3.

The present invention will be explained hereunder on the basis of the embodiments shown in the drawings.

Figure 5:
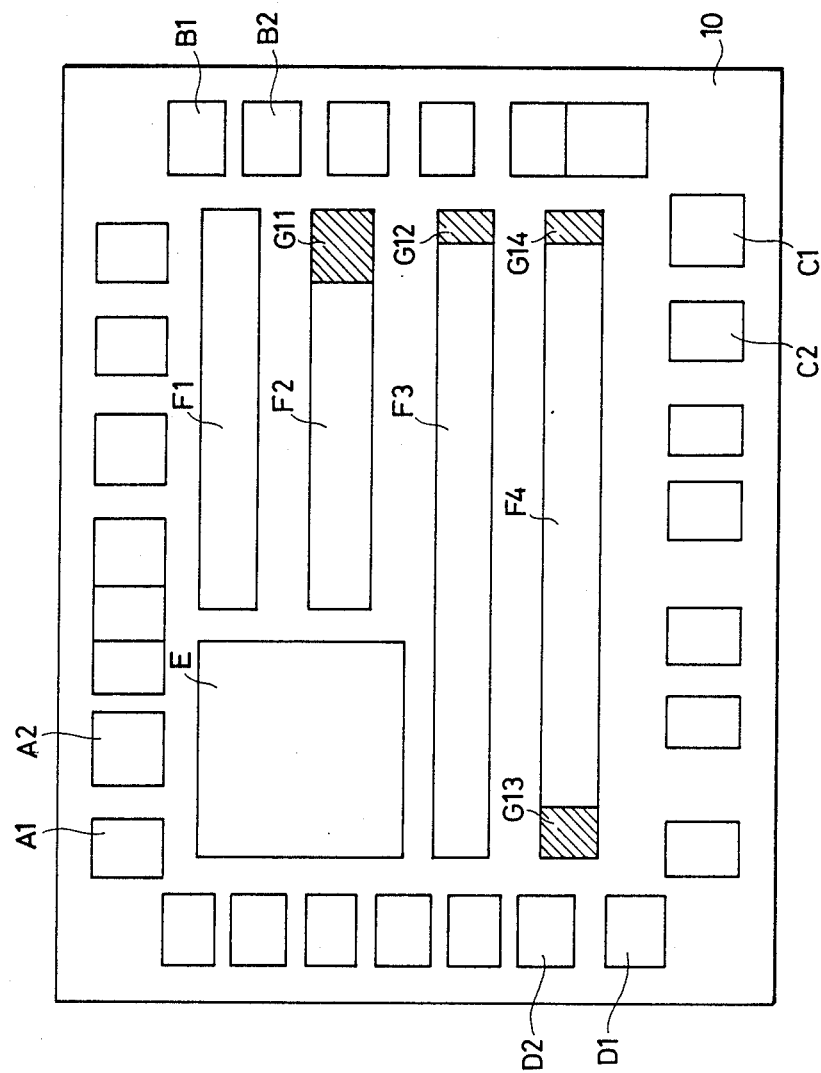
FIG. 5 is a view showing an arrangement of cells on a semiconductor chip in an embodiment of the semiconductor integrated circuit device according to the present invention.

FIG. 5 shows an arrangement of cells on a semiconductor chip in an embodiment of the standard-cell semiconductor integrated circuit device according to the present invention.

Figure 7:
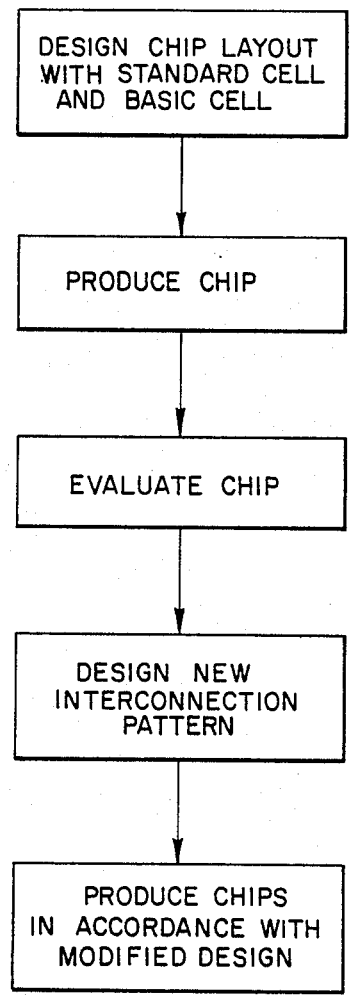
FIG. 7 is a block diagram illustrating the steps of the design process of the present invention.

On the surface of a rectangular semiconductor chip 10, there are formed, along its four sides, standard cells A1, A2, . . . , B1, B2, . . . , C1, C2, . . . , D1, D2, . . . , constructing I/O buffers and standard cells E, F1 to F4 are arranged inside those peripheral standard cells to construct various logical function blocks. Each of the standard cells A1, A2, . . . , B1, B2, . . . , C1, C2, . . . , D1, D2, . . . , E and F1 to F4 is comprised of at least one type of standard cell selected from a pre-registered standard cell library retained by a computer. The layout of the standard cells on said semiconductor chip 10 and the routing therebetween are automatically conducted by a computer system including a CAD/ CAE system as well known. Further, after the placement and wiring of this plurality of standard cells, with respect to at least one of said standard cells (in the case of FIG. 5, the standard cells F2, F3 and F4) and on the surface region of the semiconductor chip 10 on which the standard cells are not arranged and which is not used for routing or the like, basic cell or cells G11, G12, G13 and G14 for general-purpose logical gates are arranged. The placement of these basic cells is designed again by means of the computer system. Circuit elements such as transistors, diodes, resistors, etc. of the respective standard cells and the respective basic cells are formed by such processes as of the ordinary masking layer formation, photolithography and impurity injection up to the step before the routing step. The obtained semiconductor integrated circuit device is evaluated and then, on the basis of the result of this evaluation or according to an alteration of the specification, the design of this device may be altered. Thus, in response to such alteration, the wiring and/or routing design is changed and a final wiring/routing pattern is determined. In accordance with this final pattern, the wiring within the respective basic cells and the routing between the standard cells and the basic cells are determined as required, and thereby a semiconductor integrated circuit device having any desired logical function can be easily realized even when some alterations of the design have to be done. FIG. 7 illustrates the steps involved in designing and modifying a chip in accordance with the present invention.

Figure 6:
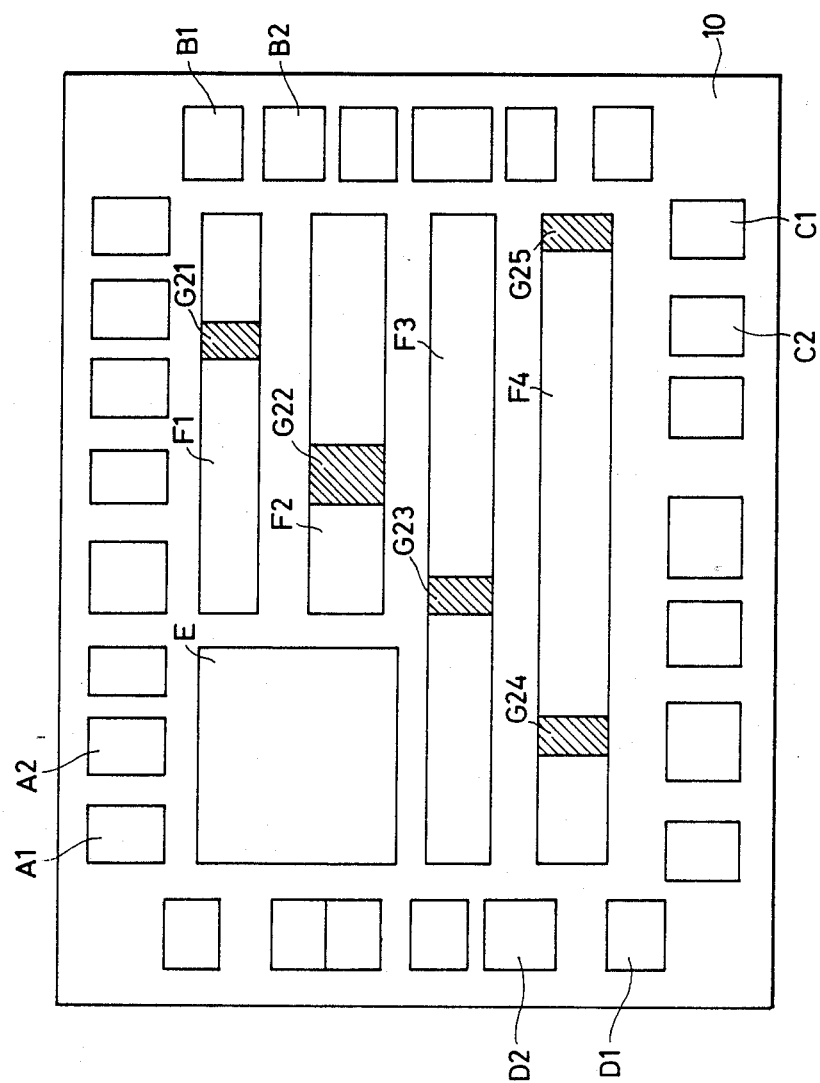
FIG. 6 is the same view as in FIG. 5, showing another embodiment of the semiconductor integrated circuit device according to the present invention.

FIG. 6 shows another embodiment of the standard-cell semiconductor integrated circuit device according to the present invention. This semiconductor integrated circuit device is constructed the same as the embodiment in FIG. 5 except that the basic cells G21, G22, G23, G24 and G25 for the general-purpose logical gates are placed at appropriate portions in the standard cells F1, F2, F3 and F4. In this case, the placement of the basic cells is carried out simultaneously with the placement of the standard cells. According to such construction, there is an advantage that the restrictions on the routing which is required upon the design alteration are less than in the embodiment in FIG. 5 because the basic cells can be placed at various portions on the chip.

What is claimed is:

1. A semiconductor integrated circuit device comprising:
    a semiconductor chip with a plurality of standard cells formed thereon, wherein the standard cells comprise an initial circuit, and wherein each of said standard cells is selected from among plural types of standard cells which are pre-registered in a standard cell library retained by a computer, the placement pattern of said standard cells on said semiconductor chip being designed automatically by a computer system in accordance with an initial circuit design which includes the standard cells as constituent elements thereof and which includes the initial design of the electrical interconnection pattern of the standard cells; and
    at least one basic cell comprised of the circuit elements for at least one general-purpose logical gate formed on said semiconductor chip in addition to the standard cells, wherein at least one of the basic cells is electrically connected to said initial circuit to form a modified circuit design different from the initial design.

2. A semiconductor integrated circuit device according to claim 1, wherein said at least one basic cell is designed to be placed in an empty region of said semiconductor chip after designing the layout of said standard cells.

3. A semiconductor integrated circuit device according to claim 1, wherein said at least one basic cell is designed to be placed on said semiconductor chip at the same time of designing the placement of said standard cells.

4. A semiconductor integrated circuit device according to claim 1, wherein wiring and routing in association with said at least one basic cell is carried out after the routing in association with said standard cells.

5. A semiconductor integrated circuit device as in claim 1, wherein a plurality of basic cells are formed on the semiconductor chip, each basic cell comprising circuit elements for at least one general purpose gate, and wherein at least one of the plural basic cells includes circuit elements not electrically connected to any other circuit elements.

6. A semiconductor integrated circuit device as in claim 5, wherein each basic cell includes as a circuit element one transistor, diode or resistor.

7. A semiconductor integrated circuit device comprising:
    a substrate;
    a plurality of standard cells formed on the substrate and comprising an initial circuit in accordance with an initial circuit design which includes the placement and the electrical interconnection of the standard cells, each standard cell made up of a predetermined arrangement of circuit elements to provide a particular logic function, wherein each standard cell is selected from a group of different types of standard cells which are stored in a standard cell library;
    a plurality of basic cells formed on the substrate in addition to the standard cells, each basic cell comprised of the circuit elements for at least one logic gate; and
    interconnections between at least one of the standard cells and at least one of the plurality of basic cells to form a modified circuit design different from the initial circuit design.

8. A semiconductor integrated circuit device as in claim 7, wherein less than all of the basic cells are electrically interconnected with the standard cells.

9. A semiconductor integrated circuit device as in claim 8, wherein each basic cell includes as a circuit element one transistor, resistor or diode.

10. A semiconductor integrated circuit device comprising:
    a semiconductor chip including a plurality of standard cells constituting an initial circuit, each standard cell providing a predetermined logic function and being selected from a library of different types of standard cells which is stored in a computer, the layout of the standard cells being designed automatically by a computer system in accordance with an initial circuit design of which the standard cells are constituent elements and which includes the design of the interconnection of the standard cells; and
    a plurality of basic cells formed on the chip in addition to the standard cells, each basic cell including the circuit elements for providing a logic function, wherein less than all of the basic cells are electrically connected to the standard cells of the initial circuit, thereby to form a modified circuit design.

11. A semiconductor integrated circuit device as in claim 10, wherein the circuit elements of the basic cells not electrically connected to the standard cells are also not electrically connected to any other circuit elements.

12. A semiconductor integrated circuit device as in claim 11, wherein each basic cell includes as a circuit element one transistor, resistor or diode.

13. A semiconductor integrated circuit device as in claim 10, wherein none of the basic cells are electrically connected to any of the standard cells.

14. A method for forming an integrated circuit chip comprising the steps of:
    designing a layout for an integrated circuit chip by (a) designing an initial circuit by selecting a plurality of standard cells, each of which provides a predetermined logic function, from a library of standard cells and determining location and interconnection of the standard cells under computer control and (b) providing at least one basic cell, which includes the circuit elements for providing a logic function and which is not connected to the initial circuit;
    producing an integrated circuit chip in accordance with said design;
    evaluating the produced chip;

designing a new interconnection pattern to form a modified circuit different from the initial circuit based on the same layout of the standard cells and the basic cells as in the initial circuit and having the circuit elements of at least one basic cell electrically interconnected to a standard cell; and producing integrated circuits in accordance with the modified design.

15. A method as in claim 14, wherein the circuit elements of the at least one electrically interconnected basic cell form a logic gate.

16. A semiconductor integrated circuit device comprising:

a semiconductor chip with a plurality of standard cells formed thereon, wherein the standard cells comprise an initial circuit, and wherein each of said standard cells is selected from among plural types of standard cells which are pre-registered in a standard cell library retained by a computer, the placement pattern of said standard cells on said semiconductor chip being designed automatically by a computer system in accordance with an initial circuit design which includes the standard cells as constituent elements thereof and which includes the initial design of the electrical interconnection pattern of the standard cells; and a plurality of basic cells in addition to the standard cells, each basic cell being comprised of the circuit elements for at least one general-purpose logical gate, wherein the basic cells are formed on said semiconductor chip in addition to the standard cells, and wherein less than all of the basic cells are electrically connected to said initial circuit to thereby form a modified circuit different from the initial circuit design.

17. A method for forming integrated circuits comprising the steps of:

designing a layout for an integrated circuit chip by (a) designing an initial circuit by selecting a plurality of standard cells from a library of standard cells (b) determining the locations and interconnections of the standard cells and (c) providing at least one basic cell in the layout of the integrated circuit which basic cell is not connected to the initial circuit;

producing an integrated circuit chip in accordance with said design, including the at least one unconnected basic cell and the electrically interconnected standard cells;

evaluating the produced design;

modifying the interconnections to form a modified circuit based on the same layout of the standard cells and the basic cells as in the initial circuit and having at least one basic cell electrically interconnected to a standard cell; and producing integrated circuits in accordance with the modified design.

18. A method as in claim 17, wherein the at least one electrically interconnected basic cell includes circuit elements forming a logic gate.

19. A semiconductor integrated circuit device comprising:

a semiconductor chip having a plurality of standard cells formed thereon, wherein the standard cells constitute an initial circuit, and wherein each of said standard cells is selected from among plural types of standard cells which are pre-registered in a standard cell library;

first electrical interconnections between the standard cells;

a plurality of basic cells formed on said semiconductor chip in addition to the standard cells; and second electrical interconnections between the standard cells and less than all of the basic cells, wherein the second electrical interconnections form a modified circuit different from the initial circuit.

20. A semiconductor integrated circuit device as in claim 19, wherein each of the basic cells includes circuit elements for forming a logic gate, the semiconductor integrated circuit device further comprising third electrical interconnections between the circuit elements of less than all of the basic cells, said third interconnections forming logic elements from the interconnected circuit elements.

* * * * *